US010514423B2

(12) United States Patent
Shiraishi

(10) Patent No.: US 10,514,423 B2
(45) Date of Patent: Dec. 24, 2019

(54) MONITORING DEVICE FOR ENERGY STORAGE DEVICE, ENERGY STORAGE DEVICE MODULE, AND METHOD OF ESTIMATING SOC

(71) Applicant: GS Yuasa International Ltd., Kyoto-shi (JP)

(72) Inventor: Takeyuki Shiraishi, Kyoto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 0 days.

(21) Appl. No.: 15/442,396

(22) Filed: Feb. 24, 2017

(65) Prior Publication Data
US 2017/0254856 A1 Sep. 7, 2017

(30) Foreign Application Priority Data
Mar. 1, 2016 (JP) .................................. 2016-038758

(51) Int. Cl.
| | | |
|---|---|---|
| G01R 31/327 | (2006.01) | |
| H02J 7/00 | (2006.01) | |
| H02J 7/04 | (2006.01) | |
| H02J 7/16 | (2006.01) | |
| G01R 31/3832 | (2019.01) | |

(Continued)

(52) U.S. Cl.
CPC .......... G01R 31/3832 (2019.01); B60R 16/03 (2013.01); G01R 31/367 (2019.01); G01R 31/389 (2019.01); G01R 31/3828 (2019.01); G01R 31/007 (2013.01)

(58) Field of Classification Search
CPC .......... G01R 31/327; G01R 31/36; H02J 7/00

USPC ........ 324/415, 426, 430; 320/106, 107, 118, 320/120, 128, 132, 134, 136
See application file for complete search history.

(56) References Cited

U.S. PATENT DOCUMENTS

| 8,779,729 B2 * | 7/2014 | Shiraishi ............... G06F 1/3212 320/155 |
|---|---|---|
| 2007/0090803 A1 * | 4/2007 | Yun ....................... B60L 3/0046 320/128 |

(Continued)

FOREIGN PATENT DOCUMENTS

| JP | H05-341023 A | 12/1993 |
|---|---|---|
| JP | 2006-149070 A | 6/2006 |

(Continued)

OTHER PUBLICATIONS

Japanese Office Action dated Oct. 29, 2019, in Japanese Patent Application No. 2016-038758 with an English translation.

*Primary Examiner* — Neel D Shah
(74) *Attorney, Agent, or Firm* — McGinn IP Law Group, PLLC

(57) ABSTRACT

A monitoring device for an energy storage device mounted on a vehicle includes: a memory; and a processor, wherein the memory is configured to store at least one of data on an estimated value of a parking-time discharge current, which the energy storage device discharges during parking, and data for calculating the estimated value of the parking-time discharge current. The processor is configured to perform first SOC estimation processing in which an SOC of the energy storage device is estimated by integrating estimated values of the parking-time discharge current based on the data stored in the memory when the vehicle is in a parking state.

21 Claims, 11 Drawing Sheets

(51) Int. Cl.
*G01R 31/367* (2019.01)
*G01R 31/389* (2019.01)
*B60R 16/03* (2006.01)
*G01R 31/3828* (2019.01)
*G01R 31/00* (2006.01)

(56) References Cited

U.S. PATENT DOCUMENTS

| | | | | |
|---|---|---|---|---|
| 2007/0114972 | A1* | 5/2007 | Koo | G01R 31/3679 320/132 |
| 2007/0188150 | A1* | 8/2007 | Yamaguchi | H02J 7/0029 320/136 |
| 2013/0229186 | A1* | 9/2013 | Shiraishi | G01R 31/327 324/415 |
| 2013/0300425 | A1* | 11/2013 | Shiraishi | G01R 31/362 324/426 |
| 2014/0104739 | A1* | 4/2014 | Nakamoto | H01M 10/42 361/160 |
| 2014/0159670 | A1* | 6/2014 | Lee | B60L 3/0007 320/134 |

FOREIGN PATENT DOCUMENTS

| | | |
|---|---|---|
| JP | 2006-211800 A | 8/2006 |
| JP | 2007-078377 A | 3/2007 |
| JP | 2009-241633 A | 10/2009 |
| JP | 2010-025563 A | 2/2010 |
| JP | 5141424 B2 | 2/2013 |

* cited by examiner

FIG. 5

| MEMORY CONTENT | TYPE OF ESTIMATED VALUE |
|---|---|
| ESTIMATED VALUE OF CONSTANT DISCHARGE CURRENT Ic1 | FIXED VALUE |
| ESTIMATED VALUE OF VEHICLE DARK CURRENT Ic2 | CHANGE FOR KIND OF AUTOMOBILE |
| ESTIMATED VALUE OF PARKING-TIME DISCHARGE CURRENT Ic | CHANGE FOR KIND OF AUTOMOBILE |

MONITORING DEVICE FOR ENERGY STORAGE DEVICE, ENERGY STORAGE DEVICE MODULE, AND METHOD OF ESTIMATING SOC

CROSS-REFERENCE TO RELATED APPLICATIONS

This application claims the benefit of Japanese patent application No. 2016-038758, filed on Mar. 1, 2016, which is incorporated by reference.

FIELD

The present invention relates to a technique for estimating an SOC (state of charge) of an energy storage device.

BACKGROUND

As a parking-time discharge current which a battery discharges during parking, a vehicle dark current, a consumption current of a battery control device, a self discharge current and the like are named. A vehicle dark current is an electric current which flows into a certain electric load (specific electric load) of a vehicle from the battery during parking. As a certain electric load, a backup memory, security equipment or the like can be exemplified. A self discharge current is an electric current consumed by a reaction (for example, a reaction between an active material and an electrolyte solution or the like) in the battery, and is an electric current which is constantly consumed regardless of a use state of the battery.

Such a parking-time discharge current is usually an extremely small electric current of 100 mA or less and hence, when a current sensor is required to have a large current measurement range, there exists a drawback that a measurement error becomes large. To suppress such a measurement error of the parking-time discharge current, a method is considered where a current detection part having high sensitivity is provided exclusively for detecting an extremely small electric current. However, the use of such a dedicated current detection part (current sensor) increases the number of parts so that a manufacturing cost is pushed up. Japanese Patent Publication No. 5141424 (patent literature 1) discloses a technique where sensitivity (gain) of a current detection part is adjusted for increasing measurement accuracy of a vehicle dark current. Although the current detection part capable of adjusting sensitivity as described in patent literature 1 exhibits high performance, the current detection part is expensive so that a manufacturing cost is eventually pushed up.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

When the current sensor is required to have a large current measurement range as described above, a measurement error of a parking-time discharge current is large. In a current integration method, an electric current is integrated and thus measurement errors are accumulated. Accordingly, to enhance estimation accuracy of an SOC of a battery during parking, it is necessary to suppress an error of a parking-time discharge current.

An object of the present invention to suppress lowering of estimation accuracy of an SOC during parking by suppressing an error of a parking-time discharge current which an energy storage device discharges during parking.

According to an aspect of the present invention, there is provided a monitoring device for an energy storage device mounted on a vehicle, wherein the monitoring device includes: a memory; and a processor, wherein the memory is configured to store at least one of data on an estimated value of a parking-time discharge current, which the energy storage device discharges during parking, and data for calculating the estimated value of the parking-time discharge current. The processor is configured to perform first SOC estimation processing in which an SOC of the energy storage device is estimated by integrating estimated values of the parking-time discharge current based on the data stored in the memory when the vehicle is in a parking state. The estimated value of the parking-time discharge current is, for example, a value estimated based on an estimated value of a self discharge current of an energy storage device or an estimated value of a vehicle dark current, and does not include a measured value (actually measured value) obtained by a current sensor.

BRIEF DESCRIPTION OF DRAWINGS

The foregoing and other features of the present invention will become apparent from the following description and drawings of an illustrative embodiment of the invention in which:

FIG. 5 is a view showing the content stored in a memory.

DESCRIPTION OF EMBODIMENTS

Figure 1:
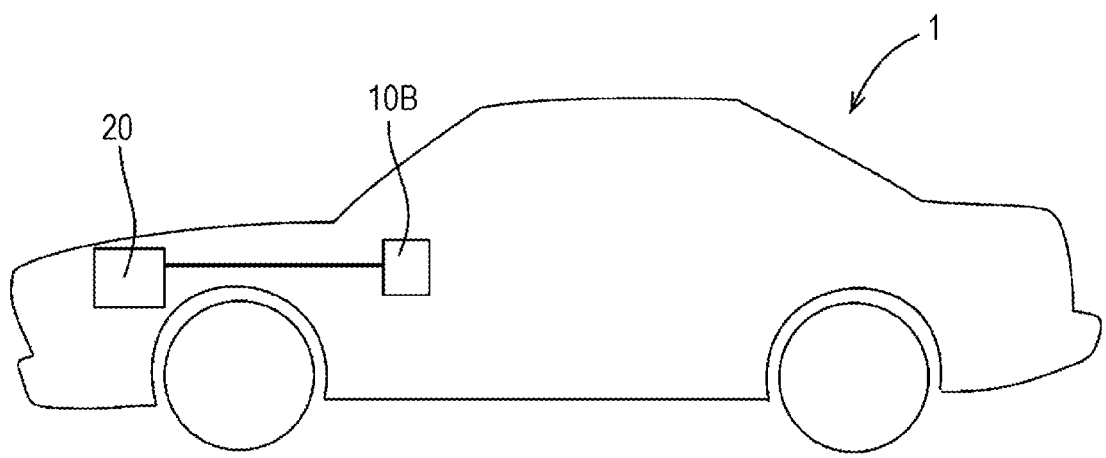
FIG. 1 is a side view of a vehicle to which a monitoring device for an energy storage device according to a first embodiment of the present invention is applied.

According to an aspect of the present invention, there is provided a monitoring device for an energy storage device mounted on a vehicle, wherein the monitoring device includes: a memory; and a processor, wherein the memory is configured to store at least one of data on an estimated value of a parking-time discharge current, which the energy storage device discharges during parking, and data for calculating the estimated value of the parking-time discharge current, and the processor is configured to perform first SOC estimation processing in which an SOC of the energy storage device is estimated by integrating estimated values of the parking-time discharge current based on the data stored in the memory when the vehicle is in a parking state. The estimated value of the parking-time discharge current is, for example, a value estimated based on an estimated value of a self discharge current of an energy storage device or an estimated value of a vehicle dark current, and does not include a measured value (actually measured value) obtained by a current sensor.

According to the monitoring device, it is possible to suppress lowering of estimation accuracy of the SOC during parking.

(Overall Configuration)

First, the overall configuration of a monitoring device for an energy storage device disclosed in this embodiment is described.

The monitoring device for an energy storage device is for monitoring an energy storage device mounted on a vehicle. The monitoring device includes: a memory; and a processor, wherein the memory is configured to store at least one of data on an estimated value of a parking-time discharge current, which the energy storage device discharges during parking, and data for calculating the estimated value of the parking-time discharge current, and the processor is configured to perform first SOC estimation processing in which an SOC of the energy storage device is estimated by integrating the estimated values of the parking-time discharge current based on the data stored in the memory when the vehicle is in a parking state.

Since a parking-time discharge current is extremely weak, when the current sensor is required to perform measurement in a wide current measurement range, there may be a case where an error of an estimated value is smaller than an error of a measured value of the current sensor. According to the above-mentioned configuration, when a vehicle is in a parking state, estimated values of a parking-time discharge current are integrated, and an SOC of the energy storage device is estimated. Accordingly, in the case where the current sensor is required to perform the measurement in a wide current measurement range, compared to the case where an SOC is estimated by actually measuring a parking-time discharge current, an error of the parking-time discharge current can be suppressed and hence, the enhancement of estimation accuracy of the SOC can be expected.

It is preferable that the monitoring device for an energy storage device have the following configuration.

The parking-time discharge current is a total electric current that is the sum of a constant discharge current, which the energy storage device constantly discharges, and a vehicle dark current, which flows into a certain electric load of the vehicle from the energy storage device during parking. The memory is configured to store at least an estimated value of the constant discharge current, and an estimated value of the vehicle dark current.

With such a configuration, a parking-time discharge current includes a constant discharge current and hence, estimation accuracy of an SOC during parking can be enhanced. That is, compared to the case where an estimated value of a parking-time discharge current does not include an estimated value of a constant discharge current but includes only an estimated value of a vehicle dark current, an error which corresponds to an amount of a constant discharge current can be suppressed and hence, estimation accuracy of an SOC during parking can be enhanced.

The processor is configured to estimate an SOC of the energy storage device by integrating the estimated values of the constant discharge current when mounting of the energy storage device on the vehicle is not detected, and the processor performs the first SOC estimation processing in which the SOC of the energy storage device is estimated by integrating the estimated values of the parking-time discharge current when the vehicle is shifted to a parking state after mounting of the energy storage device on the vehicle is detected. With such a configuration, during a period where a battery module is not mounted on the vehicle, an estimated error of an SOC is obtained by integrating only a constant consumption current excluding a vehicle dark current and hence, the estimated error of the SOC during the period where the battery module is not mounted on the vehicle can be suppressed. Further, the estimated error of the SOC during the period where the battery module is not mounted on the vehicle is suppressed and hence, even after the battery module is mounted on the vehicle, estimation accuracy of the SOC is further enhanced. That is, estimation accuracy of the SOC at a point of time that the battery module is mounted on the vehicle is high and hence, even after the battery module is mounted on the vehicle, estimation accuracy of the SOC is inevitably increased.

The monitoring device is connected to a current sensor which measures an electric current of the energy storage device, and the processor determines whether or not an electric current equal to or less than an upper limit value of the vehicle dark current flows into the vehicle from the energy storage device based on a measured value of the current sensor, the processor performs the first SOC estimation processing when the vehicle is in a parking state, and the electric current equal to or less than the upper limit value of the vehicle dark current flows into the vehicle from the energy storage device, and the processor performs second SOC estimation processing for estimating the SOC of the energy storage device by integrating an electric current of the energy storage device measured by the current sensor when the vehicle is in a parking state, and an electric current larger than the upper limit value of the vehicle dark current flows into the vehicle from the energy storage device With such a configuration, when the vehicle is in a parking state and an electric current which is equal to or less than an upper limit value of a vehicle dark current flows into the vehicle from the energy storage device, an SOC is estimated by integrating estimated values of a parking-time discharge current (first SOC estimation processing). On the other hand, in a state where the vehicle is in a parking state and an electric current larger than the upper limit value of the vehicle dark current flows into the vehicle from the energy storage device, the SOC is estimated by integrating an electric current measured by the current sensor (second SOC estimation processing). That is, two estimation methods are switched based a magnitude relationship between an electric current which flows into the vehicle from the energy storage device and an upper limit value of a vehicle dark current and hence, the further enhancement of estimation accuracy of an SOC can be expected.

The estimated value of the parking-time discharge current stored in the memory is a value which differs depending on a kind or a grade of the vehicle. With such a configuration, an estimated value of a parking-time discharge current is changed depending on a kind or a grade of the vehicle and hence, compared to the case where an estimated value of a parking-time discharge current is set to a fixed value, an error of a parking-time discharge current can be suppressed.

The processor performs: processing where the processor acquires an error amount of the estimated value of the parking-time discharge current from the outside or calculates the error amount internally; and correction processing where the processor corrects the estimated value of the parking-time discharge current stored in the memory based on the acquired or calculated error amount. With such a configuration, an estimated value of a parking-time discharge current is corrected. Accordingly, even when individual irregularities (individual irregularities in the respective vehicles) exist in parking-time discharge currents, it is possible to make an estimated value of each parking-time discharge current approach a true value and hence, estimation accuracy of an SOC during parking can be enhanced. As an example where an estimated value of a parking-time discharge current is corrected by acquiring an error amount of an estimated value from the outside, a case where an electric component or the like is added may be exemplified. That is, by acquiring a value of a dark current which the added electric component consumes from the outside such as a manufacturer of the electric component, for example, and by correcting an estimated value of a parking-time discharge current, it is possible to suppress an error of the parking-time discharge current.

The processor calculates an error amount of the estimated value of the parking-time discharge current based on a difference between the SOC estimated by an OCV method during parking of the vehicle and the SOC estimated by a current integration method which integrates the estimated values of the parking-time discharge current or a difference between capacitance estimated by the OCV method and capacitance estimated by the current integration method which integrates the estimated values of the parking-time discharge current, and an integration time T of the estimated values.

With such a configuration, an error amount of an estimated value of a parking-time discharge current can be obtained without using a current sensor, and correction processing where the estimated value of the parking-time discharge current is corrected can be performed based on the obtained error amount.

The processor determines that the energy storage device is in an abnormal state when the difference between the SOCs or a magnitude of the difference between the capacitances per unit time exceeds a reference value. With such a configuration, it is possible to determine whether or not an energy storage device is in an abnormal state.

The technique of the present invention is applicable to an estimation method of an SOC and an estimation program of an SOC.

<First Embodiment>

Next, a first embodiment of the present invention is described with reference to FIG. 1 to FIG. 6.

1. Description of Battery Module

Figure 2:
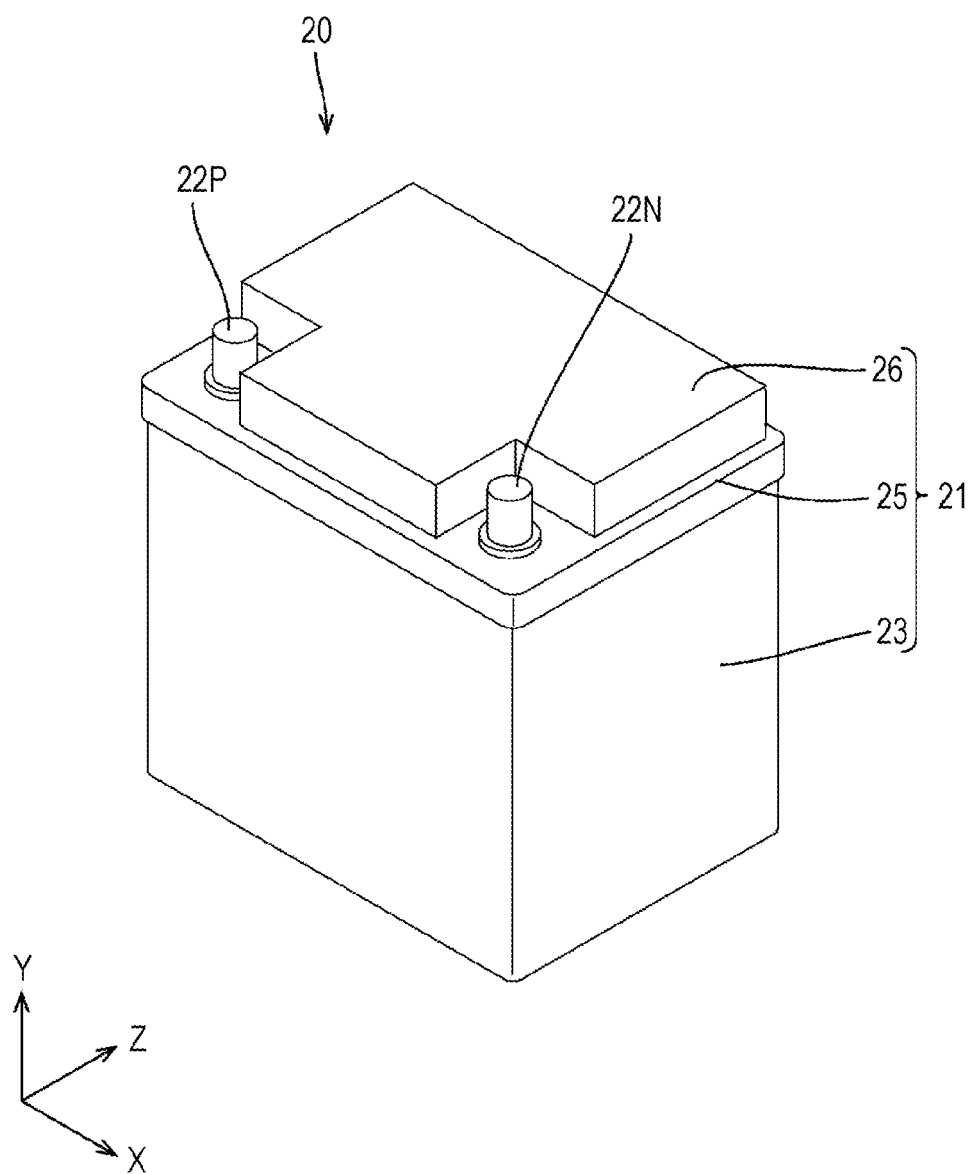
FIG. 2 is a perspective view of a battery module.
Figure 3:
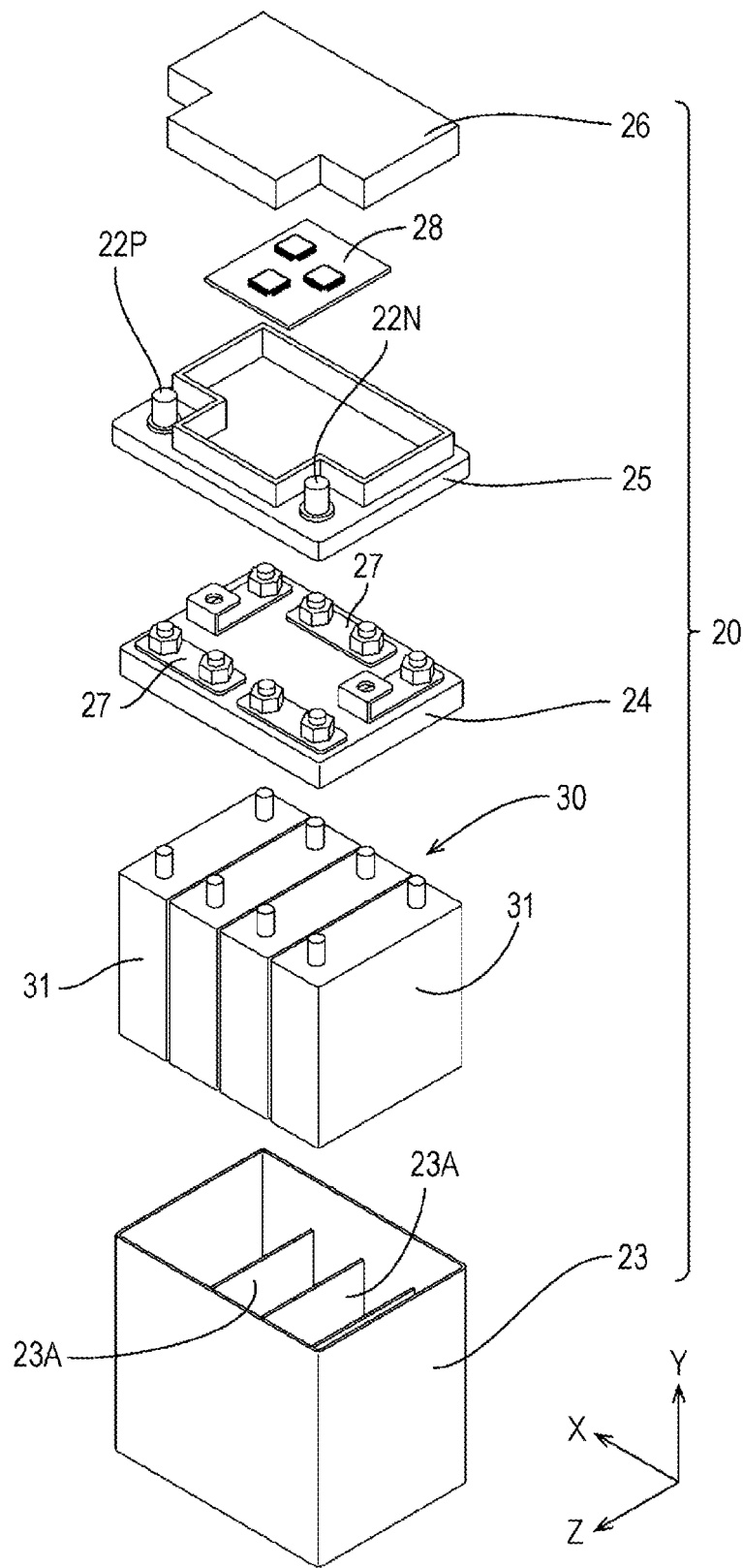
FIG. 3 is an exploded perspective view of the battery module.
Figure 4:
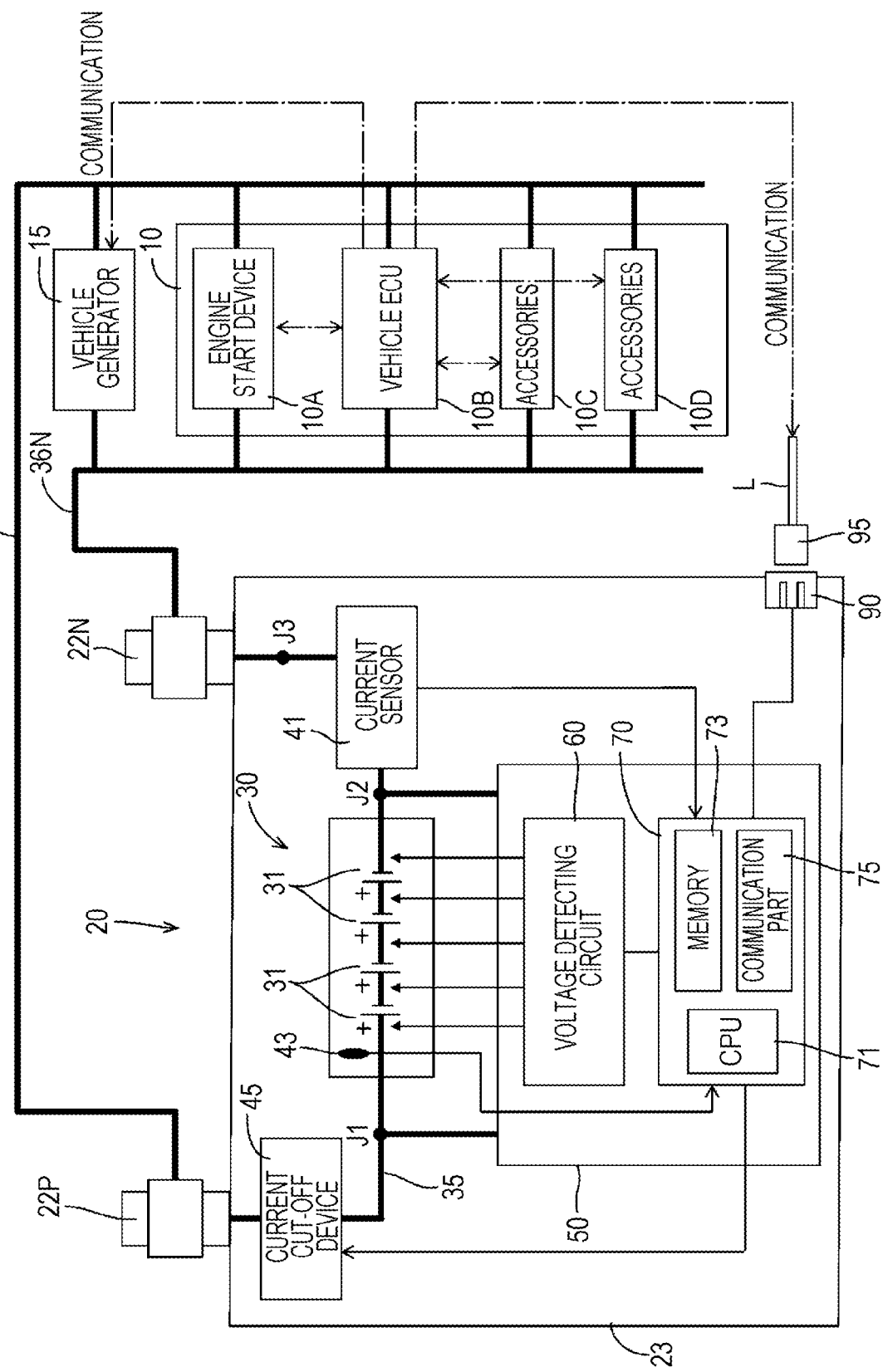
FIG. 4 is a block diagram showing the electrical configuration of the battery module.

FIG. 1 is a side view of a vehicle, FIG. 2 is a perspective view of a battery module, FIG. 3 is an exploded perspective view of the battery module, and FIG. 4 is a block diagram showing the electrical configuration of the battery module.

As shown FIG. 1, an automobile (one example of a vehicle hereinafter) 1 includes a battery module (one example of "energy storage device module" of the present invention) 20.

The battery module 20 includes a block-like battery case 21 as shown in FIG. 2. In the inside of the battery case 21, an assembled battery 30 formed of a plurality of secondary batteries 31 and a printed circuit board 28 are housed. In the description made hereinafter, in the case where FIG. 2 and FIG. 3 are referenced, the description is made by assuming a vertical direction of the battery case 21 when the battery case 21 is placed horizontally without inclination with respect to the mounting surface as "Y direction", a direction which extends along a long side direction of the battery case 21 as "X direction" and a depth direction of the battery case 21 as "Z direction".

As shown in FIG. 3, the battery case 21 includes: a box-like case body 23 which opens upwardly; a positioning member 24 which positions a plurality of secondary batteries 31; an intermediate lid 25 mounted on an upper portion of the case body 23; and an upper lid 26 mounted on an upper portion of the intermediate lid 25. As shown in FIG. 3, a plurality of cell chambers 23A in which each secondary battery 31 is housed respectively are arranged in the case body 23 in a row in the X direction.

As shown in FIG. 3, a plurality of bus bars 27 are disposed on an upper surface of the positioning member 24, and the positioning member 24 is disposed above the plurality of secondary batteries 31 disposed in the inside of the case body 23. With such a configuration, the plurality of secondary batteries 31 are positioned and are connected to each other in series by the plurality of bus bars 27.

As shown in FIG. 2, the intermediate lid 25 has an approximately rectangular shape as viewed in a plan view, and is also formed in a shape where height difference is made in the Y direction. On both end portions of the intermediate lid 25 in the X direction, a pair of terminal portions 22P, 22N to which harness terminals not shown in the drawing is connected are mounted. The pair of terminal portions 22P, 22N are made of metal such as a lead alloy, for example. Reference symbol 22P indicates the positive-electrode side terminal portion, and reference symbol 22N indicates the negative-electrode side terminal portion.

As shown in FIG. 3, the intermediate lid 25 is configured to house the printed circuit board 28 therein. When the intermediate lid 25 is mounted on the case body 23, the secondary batteries 31 and the printed circuit board 28 are connected to each other.

Next, the electrical configuration of electric loads 10 of the automobile 1 and the battery module 20 is described with reference to FIG. 4. The electric loads 10 of the automobile 1 include: an engine start device 10A such as a cell motor; a vehicle ECU (Electronic Control Unit) 10B which performs a control of the automobile 1; and accessories 10C, 10D. The accessories 10C, 10D include a headlight, a cabin light, an audio set, a clock, and a security device.

These electric loads 10 are connected with the battery module 20 and a vehicle generator 15 through a power source line 36P and a ground line 36N, and electricity is supplied to the electric loads 10 from the battery module 20 and the vehicle generator 15. That is, when the vehicle generator 15 is not generating electricity such as during parking or during stopping (including idling stopping), electricity is supplied to the electric loads 10 from the battery module 20. When the automobile 1 is traveling and an amount of generated electricity exceeds a load, for example, electricity is supplied to the load from the vehicle generator 15 and the battery module 20 is charged with surplus electricity. On the other hand, when an amount of generated electricity is below the load, electricity is supplied to the load not only from the vehicle generator 15 but also from the battery module 20 so as to compensate for a shortage of electricity.

The battery module 20 includes: the assembled battery 30; a current sensor 41; a temperature sensor 43; a current cut-off device 45; a battery management device (hereinafter referred to as BM) 50 which manages the assembled battery 30; and a connector connecting portion 90. The assembled battery 30 is formed of a plurality of lithium ion secondary batteries (one example of "energy storage devices" of the present invention) 31 which are connected in series.

The assembled battery 30, the current sensor 41 and the current cut-off device 45 are connected to each other in series through a connecting line 35. In this embodiment, the current sensor 41 is disposed on a negative electrode side, and the current cut-off device 45 is disposed on a positive electrode side. The current sensor 41 is connected to the negative-electrode side terminal portion 22N, and the current cut-off device 45 is connected to the positive-electrode side terminal portion 22P.

The current sensor 41 is disposed in the inside of the battery case 21, and performs a function of detecting an electric current which flows in the secondary batteries 31. The temperature sensor 43 is a contact-type sensor or a non-contact-type sensor and performs a function of measuring a temperature [° C.] of the secondary batteries 31.

The current sensor 41 and the temperature sensor 43 are electrically connected to the BM 50 by signal lines, and detected values of the current sensor 41 and the temperature sensor 43 are fetched by the BM 50. The current sensor 41 is disposed in the inside of the battery case 21.

The current cut-off device 45 is disposed in the inside of the battery case 21. The current cut-off device 45 is, for example, a semiconductor switch such as an FET or a relay. The current cut-off device 45 performs functions of cutting off an electric current of the secondary battery 31 by opening the power line 35 on a positive electrode side in response to an instruction (control signal) from the BM 50.

The connector connecting portion 90 is mounted on an outer surface of the case body 23. The BM 50 is configured such that, by connecting a communication-use connector 95 to the connector connecting portion 90, the BM 50 is connected to a vehicle ECU 10B through a communication line L such that the BM 50 and the vehicle ECU 10B can communicate with each other.

The BM 50 includes a voltage detecting circuit 60 and the control part 70, and is mounted on the printed circuit board 28. Further, as shown in FIG. 4, a power source line of the BM 50 is connected to a node J1 on a positive electrode side of the assembled battery 30, and a ground line is connected to a node J2 on a negative electrode side of the assembled battery 30. Electricity is supplied to the BM 50 from the assembled battery 30.

The voltage detecting circuit 60 is connected to both ends of the respective secondary batteries 31 through detection lines, and performs a function of measuring voltages of the respective secondary batteries 31 and a total voltage of the assembled battery 30 in response to an instruction from the control part 70.

The control part 70 includes: a CPU (one example of "processor" of the present invention) 71 which is a central processing unit; a memory (one example of "memory" of the present invention) 73; and a communication part 75. The CPU 71 monitors an electric current, a voltage and a temperature of each secondary battery 31 based on outputs from the current sensor 41, the voltage detecting circuit 60 and the temperature sensor 43. When the CPU 71 detects an abnormality, the CPU 71 operates the current cut-off device 45 so as to prevent the secondary battery 31 from being brought into a dangerous state.

The CPU 71 also performs processing of estimating an SOC of the secondary battery 31 by a current integration method. SOC (state of charge) indicates a charge state of the secondary battery 31, and "SOC" is defined by the following equation 1 in this specification.

$$SOC = \frac{Y}{Y_O} \times 100 \quad \text{[Equation 1]}$$

In the equation 1, "Y" indicates a charge amount (remaining capacitance) [Ah] of the secondary battery 31, and "Yo" indicates a full charge capacitance [Ah] of the secondary battery 31.

The current integration method is a method where a charge/discharge current I of the secondary battery 31 is measured, and a measured value is integrated to an SOC at the point of time of measurement thus estimating the SOC at a next point of time of measurement. That is, the current integration method calculates an accumulated charge/discharge amount by integrating electric currents I outputted from the current sensor 41. Then, the current integration method estimates the SOC at a next point of time of measurement by adding a change amount of the SOC calculated based on the accumulated charge/discharge amount to a present value of the SOC.

$$SOC = SOC_O + \frac{1}{Y_O} \times \int I \Delta t \quad \text{[Equation 2]}$$

A first item in a right side of the equation 2 indicates a present value of the SOC, and a second item of the right side indicates a change amount of the SOC from the present value.

The memory 73 is a non-volatile memory such as a flash memory or an EEPROM. In the memory 73, a monitoring program for monitoring the secondary batteries 31, a program for performing SOC estimation processing, and data necessary for executing these programs are stored. Besides these data, data on an estimated value of a constant discharge current Ic1, data on an estimated value of a vehicle dark current Ic2, and data on an estimated value of a parking-time discharge current Ic are stored in the memory 73 in advance (see FIG. 5).

2. Measurement Error of Current Sensor and Estimated Value of Parking-time Discharge Current In the current integration method, an SOC is estimated by integrating current values. Accordingly, to enhance estimation accuracy of the SOC, it is necessary to suppress a measurement error of an electric current. However, "parking-time discharge current Ic" of the secondary battery 31 is an extremely small electric current of less than 100 mA and hence, when the current sensor 41 is required to perform the measurement in a wide current measurement range, it is difficult to measure an electric current accurately.

Particularly, the secondary battery 31 is used for starting an engine and hence, there may be a case where a cranking current near 1000 A flows. Accordingly, in an attempt to measure a cranking current over the whole range based on a parking-time discharge current Ic by one current sensor, the current sensor is required to perform the measurement in a wide current measurement range and hence, the resolution of the sensor becomes large (becomes coarse). Accordingly, a measurement error of the parking-time discharge current Ic becomes large and hence, there is a concern that the estimation accuracy of the SOC is lowered due to the accumulated measurement error by integration during parking.

"Parking-time discharge current Ic" is an electric current which the secondary battery 31 discharges during parking. In this specification, the parking-time discharge current Ic is a total electric current which is the sum of a constant discharge current Ic1 and a vehicle dark current Ic2 as expressed in the following equation 3.

$$I_C = I_{C1} + I_{C2} \quad \text{[Equation 3]}$$

"Constant discharge current" is an electric current which the secondary battery 31 constantly discharges regardless of an in-use state of the secondary battery 31, for example, regardless of whether or not the battery module 20 is mounted on the automobile 1. A constant discharge current Ic1 includes a self discharge current and a consumption current of the BM 50.

"Self discharge current" is an electric current which is self-discharged due to a reaction in the battery (for example, a reaction between an active material and an electrolyte solution or the like).

"Consumed current of the BM 50" is an electric current consumed due to the flow of the electric current from the secondary battery 31 to the BM 50. That is, the BM 50 uses the secondary battery 31 as a power source, and is operated with the supply of electricity from the secondary battery 31. The BM 50 constantly monitors the secondary batteries 31 regardless of an in-use state of the battery module 20 such as whether or not the secondary battery 31 is used in a single unit state or whether or not the battery module 20 is mounted on the automobile 1 and hence, a consumption current of the BM 50 is constantly consumed.

"Vehicle dark current" is an electric current which is consumed when the electric current flows to a certain electric load mounted on the automobile 1 from the secondary battery 31 in the following states (A) and (B). As such a certain electrical load, for example, a clock, an audio set, a security device, a memory of a vehicle ECU or the like can be exemplified. The certain electric load is an electric load which consumes electricity using the secondary battery 31 as a power source during parking.

(A) A state where an ignition key is removed from an ignition key cylinder of the automobile
(B) A state where all doors of the automobile are closed and all switches and the like of the automobile are turned off
(C) A state where an electronic key is located outside an operational range where radio communication with the vehicle becomes impossible The above-mentioned conditions (A) and (B) are set by assuming a case of a type where a key of the automobile 1 is inserted into a cylinder. However, in the case of an electronic key of a type where the key of the automobile 1 is not inserted into the cylinder (a key of a type where a door lock is released by holding the key within an operational range or an engine is started by performing a button manipulation), the condition (C) is used in place of the condition (A), and an electric current which is consumed due to the flow of the electric current to a certain electric load mounted on the automobile 1 from the secondary battery 31 in a state under the conditions (B) and (C) is assumed as a vehicle dark current.

With respect to a parking-time discharge current Ic, there may be a case where an estimated value acquired from an estimated value (predicted value) of a constant discharge current Ic1 or a vehicle dark current Ic2 exhibits a smaller error than a value obtained by the measurement using the current sensor 41. That is, to compare an error ε1 for a true value when the parking-time discharge current Ic is measured by the current sensor 41 and an error ε2 for a true value of the estimated value of the parking-time discharge current Ic to each other, there may be a case where the error ε2 of the estimated value is smaller than the error ε1 when the parking-time discharge current Ic is measured by a current sensor 41.

In view of the above, in this embodiment, in the case of a vehicle where it is predicted that the error ε2 of the estimated value is smaller than the error ε1 when the parking-time discharge current Ic is measured by the current sensor 41 due to conditions such as resolution of the current sensor 41, a magnitude of a parking-time discharge current Ic, "estimated value" of the parking-time discharge current Ic is stored in advance in the memory 73 by writing, and during parking, estimated values of the preliminarily stored parking-time discharge currents Ic are integrated thus estimating an SOC of the secondary battery 31.

With such an operation, compared to a case where a parking-time discharge current Ic is actually measured by the current sensor 41 and the measured value is used, an error of the parking-time discharge current Ic can be suppressed. Accordingly, during parking, it is possible to suppress lowering of estimation accuracy of an SOC due to accumulation of measurement errors by integration.

A vehicle dark current Ic2 is an electric current which a certain electric load consumes during parking as described above and hence, in this embodiment, an estimated value of a vehicle dark current Ic2 written in the memory 73 is calculated from a consumption currents of these electric loads. To be more specific, in the above-mentioned states (A) and (B), a sum of respective consumption currents which are predicted to be consumed at certain electric loads mounted on the automobile 1 is set as a total consumption current. An estimated value of the vehicle dark current Ic2 is 50 mA as an example.

A self discharge current of the secondary battery 31 can be obtained by measuring a lowering amount of a terminal voltage after the battery is left in a room temperature atmosphere or the like for a fixed period after the battery is fully charged, for example. The self discharge current of the secondary battery 31 is approximately less than 1 mA based on past data. Further, a predicted consumption current of the BM 50 is also approximately 1 mA and hence, in this embodiment, an estimated value of a constant discharge current Ic1 is set to 2 mA as an example.

As shown in FIG. 5, in the memory 73 of the control part 70, not only data on an estimated value of a parking-time discharge current Ic, but also data on an estimated value of a constant discharge current Ic1 and data on an estimated value of a vehicle dark current Ic2 are also stored respectively.

It is preferable that timing at which data on estimated values of the respective electric currents Ic, Ic1, Ic2 are written in the memory 73 comes before the battery module 20 is mounted on the automobile 1. In this embodiment, the data on the estimated values of the respective electric current Ic, Ic1, Ic2 are written along with the inspection of the battery module 20 at the time of performing shipping inspection (at the time of performing shipping inspection which is performed during shipping of the battery module 20 to a vehicle maker).

When a kind of automobile 1 differs, electric loads mounted on the automobile 1 differ. Accordingly, in this embodiment, an estimated value of a vehicle dark current Ic2 is changed corresponding to the electric loads mounted on the automobile 1 as vehicle mounting objects, and estimated values of vehicle dark currents Ic2 which differ corresponding to kinds of automobiles 1 are stored in the memory 73. Further, a parking-time discharge current Ic is a sum of estimated values of a constant discharge current Ic1 and a vehicle dark current Ic2 and hence, also with respect to a parking-time discharge current Ic, estimated values of different parking-time discharge current Ic are written correspondingly to kinds of automobiles 1. In other words, provided that automobiles 1 are of the same kind, the estimated values of the vehicle dark current Ic2 and parking-time discharge current Ic are uniform. In this manner, by setting the estimated values of the vehicle dark current Ic2 and the parking-time discharge current Ic to be written in the memory 73 to different values corresponding to kinds of automobiles 1, it is possible to suppress an error of an estimated value of the vehicle dark current Ic2 and an error of the estimated value of the parking-time discharge current Ic.

A self discharge current and a consumption current of the BM 50 are the currents which depend on the battery module 20, and assume the same values regardless of a kind and a grade of the automobile 1 and hence, a constant discharge current Ic1 is set to a fixed value as shown in FIG. 5.

Figure 6:
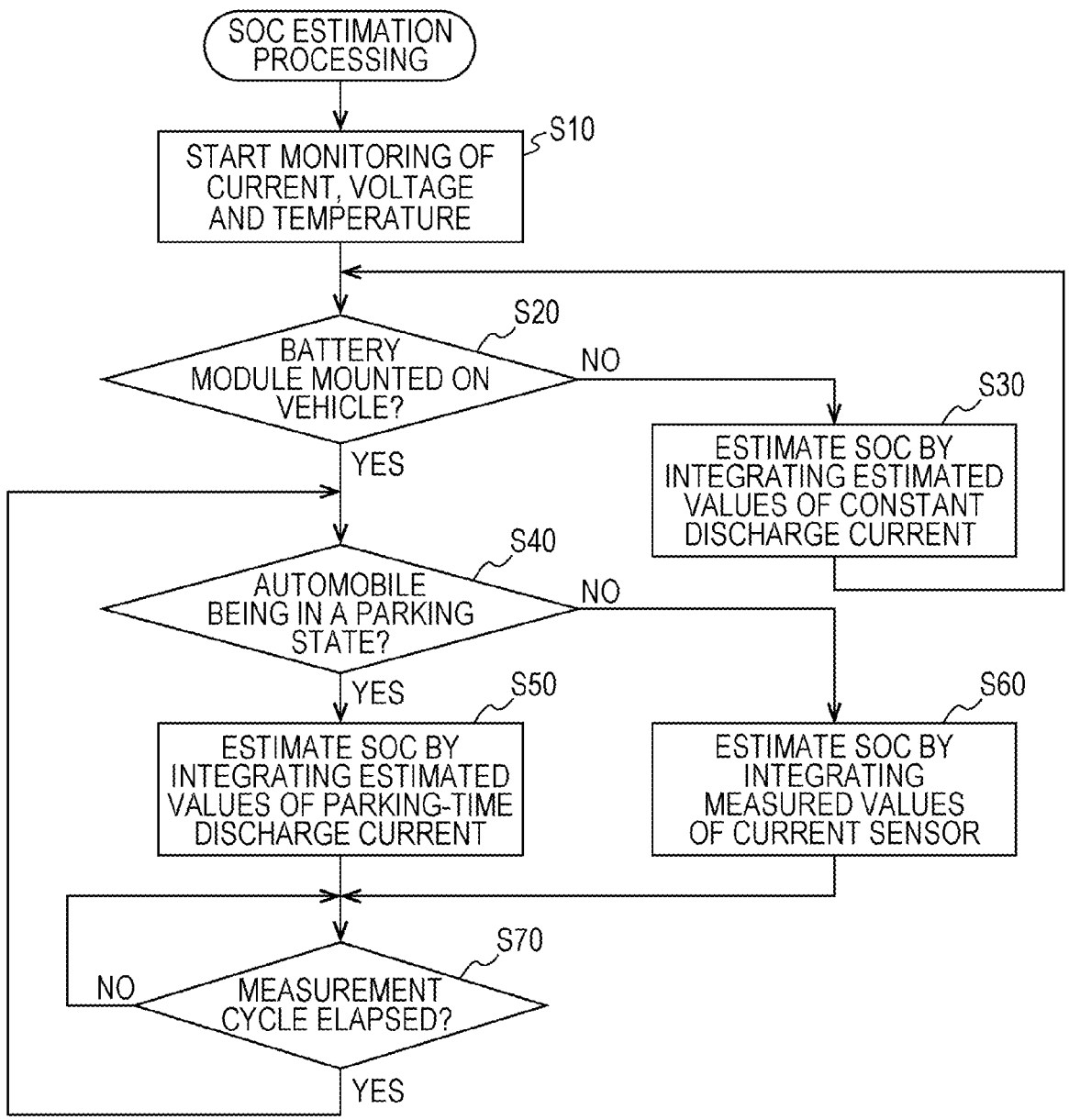
FIG. 6 is a flowchart showing the flow of SOC estimation processing.

Hereinafter, SOC estimation processing performed by the CPU 71 of the BM 50 is described with reference to FIG. 6. The SOC estimation processing shown in FIG. 6 is formed of seven steps S10 to S70, and are performed after an operation of the BM 50 is started, for example. Before the operation of the BM 50 is started, estimated values of the respective electric currents Ic, Ic1, Ic2 are already written in the memory 73.

When the SOC estimation processing starts, the CPU 71 monitors outputs of the current sensor 41, the voltage detecting circuit 60 and the temperature sensor 43, and starts processing for monitoring an electric current, a voltage and a temperature of the secondary battery 31 (S10).

Then, the CPU 71 performs processing for determining whether or not the battery module 20 is mounted on the automobile 1. The determination whether or not the battery module 20 is mounted on the automobile 1 can be performed by determining whether or not a large discharge current is momentarily detected based on an output of the current sensor 41, for example.

Figure 7:
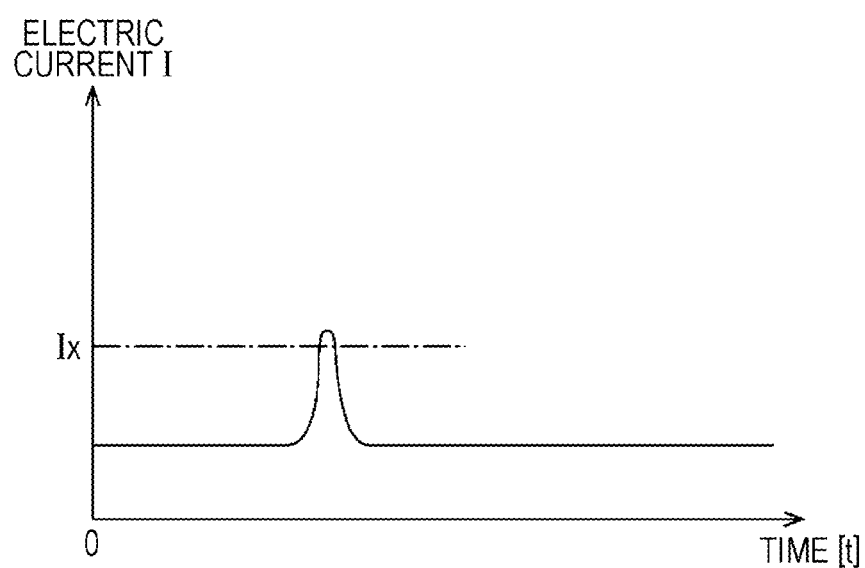
FIG. 7 is a graph showing the transition of time of an electric current when a battery is mounted on the vehicle.

That is, when the battery module 20 is mounted on the automobile 1, for charging a capacitor (not shown in the drawing) mounted on a circuit on a vehicle side, a large discharge current of a predetermined value Ix or more momentarily flows into the capacitor from the secondary battery 31 (see FIG. 7). Accordingly, when a large discharge current of a predetermined value Ix or more is momentarily detected based on a measured value of the current sensor 41, it is determined that the secondary battery 31 is mounted on the automobile 1. Whether or not a discharge current momentarily flows can be determined based on a time during which a current value exceeds a predetermined value Ix.

During a time where a large discharge current is not detected momentarily, it is determined that the battery module 20 is not mounted on the automobile 1 (S20: NO). In this case, the CPU 71 performs processing of estimating an SOC by integrating estimated values of a constant discharge current Ic1 stored in the memory 73 (S30).

Then, when a large discharge current is detected momentarily, the CPU 71 determines that the battery module 20 is mounted on the automobile 1 (S20: YES) and, thereafter, the CPU 71 performs processing for determining whether or not the vehicle is in a parking state (S40).

The determination on whether or not the automobile 1 is in a parking state can be made based on, for example, whether or not communication is stopped between the BM 50 and the vehicle ECU 10B. That is, the vehicle ECU 10B detects whether or not the automobile 1 is in a parking state based on states of an ignition switch, a door switch and other switches mounted on the automobile or the like. When it is determined that the automobile 1 is in a parking state, the vehicle ECU 10B is brought into a stop state and the communication between the vehicle ECU 10B and the BM 50 is stopped. Accordingly, the CPU 71 can determine whether or not the automobile 1 is in a parking state by detecting whether or not the communication is stopped between the CPU 71 and the vehicle ECU 10B.

In this embodiment, when a state where the communication between the CPU 71 and the vehicle ECU 10B is stopped for a predetermined period or more is detected, the CPU 71 determines that the automobile 1 is in a parking state. Parking is "a state where either the above-mentioned conditions (A) and (B) or the above-mentioned conditions (B) and (C) are satisfied and the vehicle does not move for a predetermined time".

When it is determined that the automobile 1 is in a parking state, the CPU 71 performs processing of estimating an SOC of the secondary battery 31 by integrating estimated values of parking-time discharge currents Ic stored in the memory 73 (S50). The processing in step S50 corresponds to first SOC estimation processing of the present invention.

On the other hand, when the automobile 1 is not in a parking state (for example, in a traveling state or in a stopped state), the CPU 71 estimates an SOC of the secondary battery 31 by integrating measured values of the current sensor 41 (S60). After processing in step S50 and step S60 are performed, the CPU 71 performs processing for determining whether or not a measurement cycle has elapsed from a point of time that the previous-time SOC estimation is performed (S70).

The CPU 71 is held in a standby state until the measurement cycle elapses. When the measurement cycle elapses from the point of time that the previous-time SOC estimation is performed, as the flow of the processing, the processing returns to step S40. In step S40, in the same manner as described above, an SOC is estimated by two estimation methods depending on whether or not the automobile 1 is in a parking state. That is, when the automobile 1 is in a parking state, an SOC of the secondary battery 31 is estimated by integrating estimated values of a parking-time discharge current Ic (S50). On the other hand, when the automobile 1 is not in a parking state (for example, in a traveling state or in a stopped state), an SOC of the secondary battery 31 is estimated by integrating measured values of the current sensor 41 (S60). Such processing is repeated for every measurement cycle.

3. Effect

In this embodiment, when the automobile 1 is in a parking state, the BM 50 estimates an SOC of the secondary battery 31 by integrating estimated values of a parking-time discharge current Ic stored in the memory 73 in advance. With such an operation, an error of a parking-time discharge current Ic can be suppressed and hence, the enhancement of estimation accuracy of an SOC can be expected. To be more specific, compared to a case where an SOC is estimated by measuring a parking-time discharge current Ic by the current sensor 41 having a wide current measurement range, an error of the parking-time discharge current Ic can be suppressed and hence, lowering of estimation accuracy of the SOC can be suppressed.

An estimated value of a parking-time discharge current Ic which is to be stored in the memory 73 in advance includes a constant discharge current Ic1 which the secondary battery 31 constantly discharges. Accordingly, estimation accuracy of an SOC during parking can be enhanced. That is, compared to a case where an estimated value of a parking-time discharge current Ic does not include a constant discharge current Ic1 and includes only a vehicle dark current Ic2, it is possible to suppress an error corresponding to an amount of a constant discharge current and hence, estimation accuracy of an SOC during parking can be enhanced.

In this embodiment, when the battery module 20 is not mounted on the automobile 1 (S20: NO), the BM 50 estimates an SOC of the secondary battery 31 by integrating only an estimated value of a constant discharge current Ic1 while excluding a vehicle dark current Ic2. With such an operation, during a period where the battery module 20 is not mounted on the automobile 1, it is possible to calculate a lowered amount of an SOC due to discharging of the secondary battery 31. Accordingly, estimation accuracy of an SOC can be enhanced during the period where the battery module 20 is not mounted on the automobile 1. Further, an estimation error of an SOC can be suppressed during the period where the battery module 20 is not mounted on the automobile 1 and hence, even after the battery module 20 is mounted on the automobile 1, estimation accuracy of the SOC is further enhanced. That is, estimation accuracy of the SOC at a point of time that the battery module 20 is mounted on the automobile 1 is enhanced and hence, even after such a point of time, estimation accuracy of the SOC is inevitably enhanced.

In this embodiment, the battery module 20 is formed into a module where the assembled battery 30 which is an object to be monitored and the BM 50 are housed in the battery case 21. With such a configuration, the specific assembled battery 30 and the specific BM 50 can be used in combination in one to one correspondence relationship. Accordingly, for example, it is possible to make the memory 73 of the BM 50 which is formed into a module with the assembled battery 30 store a constant discharge current Ic1 intrinsic to the assembled battery 30 therein in advance. Accordingly, an SOC can be estimated using the constant discharge current Ic1 intrinsic to the assembled battery 30 and hence, the enhancement of estimation accuracy of the SOC can be expected.

<Second Embodiment>

Figure 8:
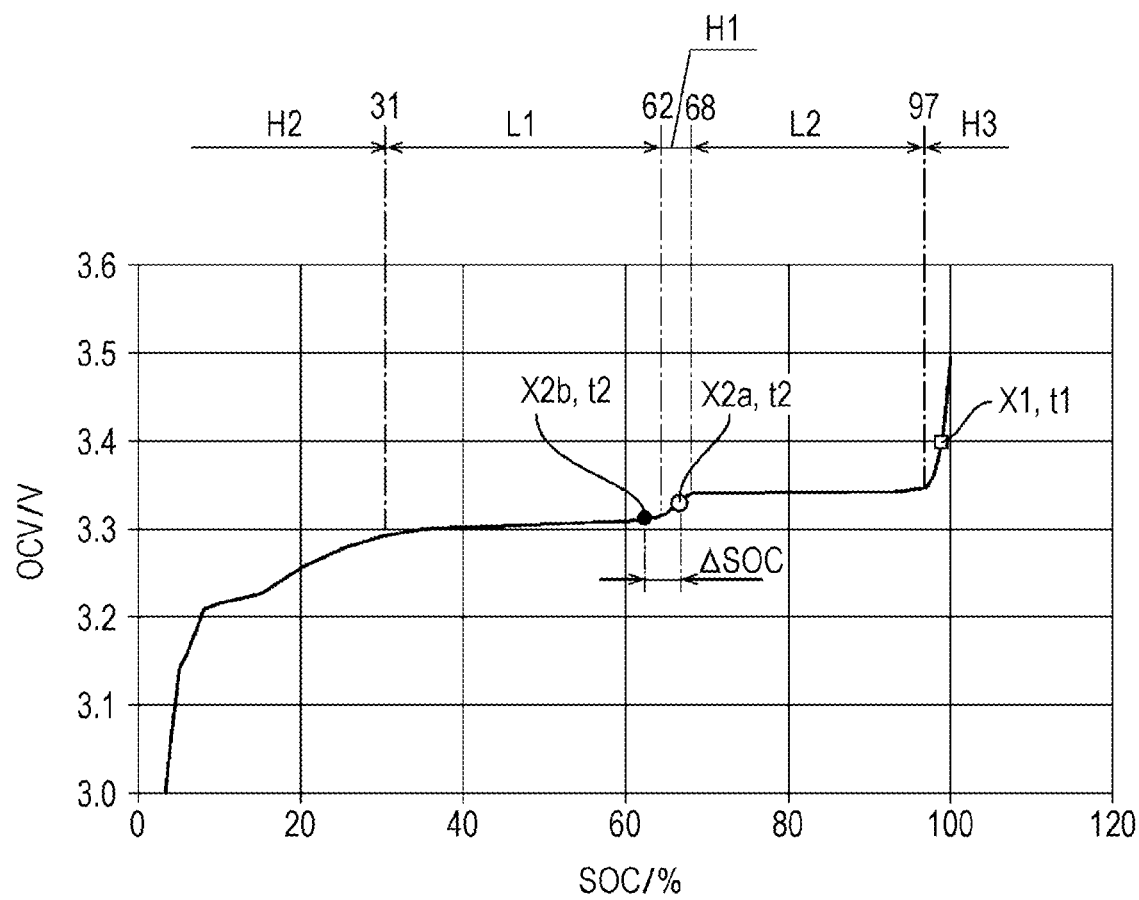
FIG. 8 is a graph showing a correlation characteristic of OCV-SOC of a secondary battery in a second embodiment.
Figure 9:
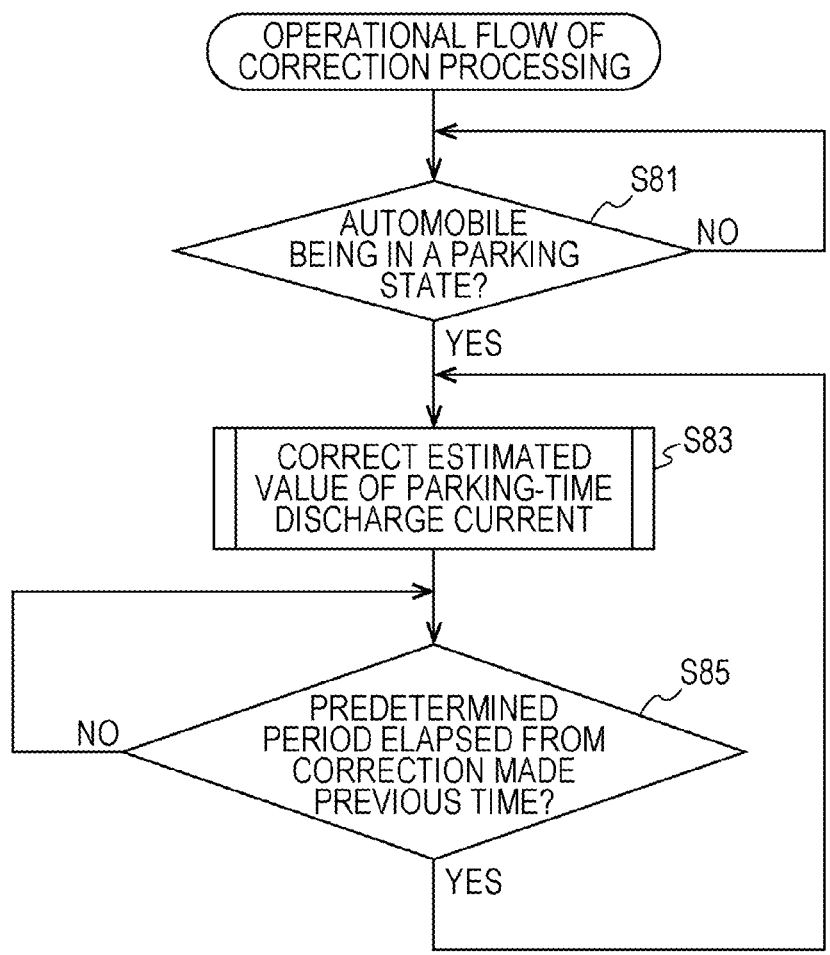
FIG. 9 is a flowchart showing an operational flow of correction processing.
Figure 10:
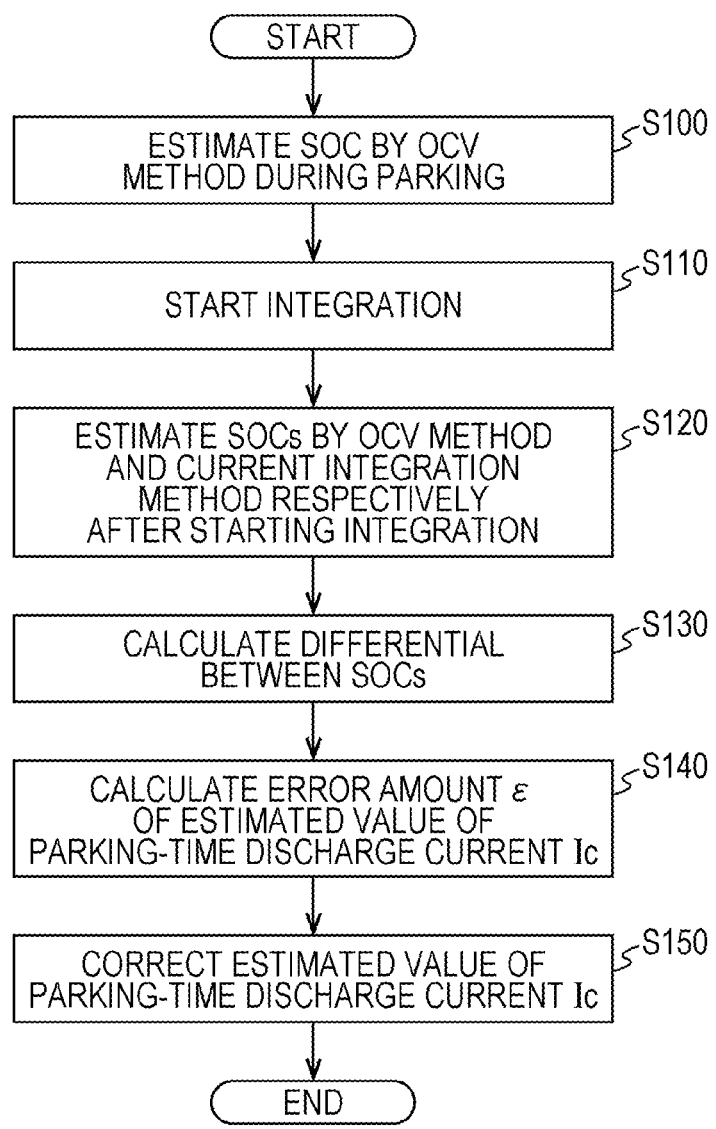
FIG. 10 is a flowchart of correction processing of a parking-time discharge current.

Next, a second embodiment of the present invention is described in conjunction with FIG. 8 to FIG. 10.

Even when automobiles 1 are of the same kind, there is a variation (individual difference) in a parking-time discharge current Ic among the automobiles 1. The reason is that there is a variation in a vehicle dark current Ic2 which occupies the most of the parking-time discharge current Ic among the automobiles 1. In this second embodiment, an error amount ε of an estimated value of the parking-time discharge current Ic is calculated, and an estimated value of the parking-time discharge current Ic is corrected. With such an operation, estimation accuracy of an SOC can be enhanced during parking.

1. Characteristic of Secondary Battery

The secondary battery 31 is a phosphoric-acid-iron based lithium ion battery which uses phosphoric-acid-iron lithium (LiFePO4) as a positive electrode active material and a graphite as a negative electrode active material. FIG. 8 is a graph showing an SOC-OCV correlation characteristic of the secondary battery 31, wherein SOC [%] is taken on an axis of abscissas, and an OCV [V] is taken on an axis of ordinates. As shown in FIG. 8, the secondary battery 31 has a plurality of charge regions, that is, a low change region where a change amount of OCV for a change amount of SOC is relatively low and a high change region where the change amount of OCV for the change amount of SOC is relatively high.

To be more specific, the secondary battery 31 has two low change regions L1, L2 and three high change regions H1, H2, H3. As shown in FIG. 8, the low change region L1 is positioned where a value of an SOC falls within a range from 31 [%] to 62 [%]. The low change region L2 is positioned where the value of the SOC falls within a range from 68 [%] to 97 [%]. In the low change region L1, a change amount of the OCV for a change amount of the SOC is extremely small so that the low change region L1 forms a plateau region where the OCV is at an approximately fixed value of 3.3 [V]. Also in the low change region L2, in the same manner as the low change region L1, the low change region L2 forms a plateau region where the OCV is at an approximately fixed value of 3.34 [V]. The plateau region is a region where a change amount of the OCV for a change amount of the SOC is equal to or less than 2 [mV/%].

The first high change region H1 is positioned between two low change regions L1, L2 and the value of the SOC falls within a range from 62 [%] to 68 [%] in the first high change region H1. The second high change region H2 is positioned more on a low SOC side than the low change region L1 and the value of the SOC is less than 31 [%] in the second high change region H2. The third high change region H3 is positioned more on a high SOC side than the low change region L2 where the value of the SOC is larger than 97 [%]. The first to third high change regions H1 to H3 have the relationship where a change amount of the OCV (gradient in a graph shown in FIG. 8) for a change amount of the SOC is relatively high compared to the low change regions L1, L2.

2. Correction Processing of Estimated Value of Parking-time Discharge Current Ic FIG. 9 is a view showing an operational flow of correction processing for correcting an estimated value of a parking-time discharge current Ic. The operational flow of correction processing is formed of three processing in steps S81, S83, S85. For example, correction processing is performed after the battery module 20 is mounted on the automobile 1.

When the operational flow of the correction processing starts, first, the CPU 71 performs processing for determining whether or not the automobile 1 is in a parking state (S81).

The determination whether or not the automobile 1 is in a parking state can be made by determining whether or not communication is stopped between the BM 50 and the vehicle ECU 10B, for example. In this embodiment, in the same manner as step S40 described in the first embodiment, when a state is detected where communication between the vehicle ECU 10B and the BM 50 is stopped for a predetermined period or more, the CPU 71 determines that the automobile 1 is in a parking state.

When the CPU 71 determines that the automobile 1 is in a parking state, thereafter, the processing advances to step S83 where the CPU 71 performs correction processing for correcting an estimated value of a parking-time discharge current Ic. The processing for correcting the estimated value of the parking-time discharge current Ic can be performed in accordance with six steps (S100 to S150) shown in FIG. 10. Correction processing formed of six steps (S100 to S150) is performed parallel to estimation processing of an SOC described in the first embodiment with reference to FIG. 6. To be more specific, during a period where processing S40, S50, S70 are repeated, correction processing formed of six steps (S100 to S150) is performed parallel to processing in steps S40, S50, S70.

In the description made hereinafter, an OCV method is a method where an SOC is estimated by making use of correlation between the SOC and an OCV. In this embodiment, data which indicates the correlation between the SOC and the OCV shown in FIG. 8 is stored in the memory 73 in advance. An OCV (Open Circuit Voltage) is an open voltage of the secondary battery 31, to be more specific, a voltage of the secondary battery 31 in the case where there is no electric current or in the case where it is considered that there is no electric current. In this embodiment, it is determined that there is substantially no electric current when an electric current of the secondary battery 31 is equal to or below a predetermined value (100 mA, for example).

(S100) Estimation of an SOC of Secondary Battery 31 During Parking by OCV Method When the CPU 71 detects that the automobile 1 is in a parking state through communication with the vehicle ECU 10B, the CPU 71 measures an OCV of the secondary battery 31 from an output of the voltage detecting circuit 60, and determines which region the secondary battery 31 is included in among the low change regions L1, L2 and the high change regions H1, H2, H3.

It is preferable that the estimation of an SOC by an OCV method be performed in the high change region H1, H2, H3. When the CPU 71 determines that an OCV of the secondary battery 31 falls in any one of the high change regions H1 to H3, the CPU 71 estimates an SOC by making use of the correlation between the SOC and the OCV. In the example shown in FIG. 8, an SOC is estimated in the high change region H3 at a first point of time t1, and an estimated value of the SOC is "X1".

(S110) Start of Integration

Then, the CPU 71 cumulates estimated values of a parking-time discharge current Ic stored in the memory 73 and calculates an accumulated charge/discharge amount Qs from the first point of time t1.

(S120) Estimation of SOCs of Secondary Battery 31 after Starting Integration by "OCV Method" and "Current Integration Method"

After starting the integration, the CPU 71 estimates an SOC of the secondary battery 31 during parking of the automobile 1 by an OCV method again. It is preferable that the estimation of the SOC by the OCV method be performed in the high change region H1, H2, H3 in the same manner as the SOC estimation performed for the first time. In the example shown in FIG. 8, the SOC is estimated in the high change region H1 at a second point of time t2, and an estimated value of the SOC by the OCV method is "$X2a$".

The CPU 71 also estimates the SOC of the secondary battery 31 by a current integration method at the second point of time t2 which is the estimation point of time of the SOC by the OCV method. That is, a change amount of the SOC after the first point of time t1 is calculated based on an accumulated charge/discharge amount Qs from the first point of time t1 to the second point of time t2 (to be more specific, an accumulated charge/discharge amount obtained by integrating estimated values of a parking-time discharge current Ic). Then, by adding "a change amount of the SOC" to the estimated value X1 of the SOC at the first point of time t1, the SOC at the second point of time t2 is obtained. In the example shown in FIG. 8, the estimated value of the SOC by the current integration method is "$X2b$".

(S130) Calculation of Difference Between SOCs

Next, the CPU 71 calculates a difference ΔSOC between an SOC estimated by the OCV method and an SOC estimated by the current integration method. The difference ΔSOC is generated due to an error of an estimated value of a parking-time discharge current Ic, and when there is no error in the estimated value of the parking-time discharge current Ic, the difference ΔSOC becomes zero or a value close to zero.

$$\Delta SOC = X2a - X2b \qquad \text{[Equation 4]}$$

In the equation 4, "$X2a$" is a value of the SOC estimated by the OCV method at the second point of time t2, and "$X2b$" is a value of the SOC estimated by the current integration method at the second point of time t2.

(S140) Calculation of Error Amount ε of Estimated Value of Parking-Time Discharge Current Ic Next, the CPU 71 calculates the error amount ε of the estimated value of the parking-time discharge current Ic based on the difference ΔSOC, an integration time T and a full charge capacitance Yo. For example, the error amount ε of the estimated value of the parking-time discharge current Ic can be calculated by the following equation 5.

$$\varepsilon = Y_O \times \Delta SOC / T \qquad \text{[Equation 5]}$$

In the equation 5, the integration time T is a time during which estimated values Ic are integrated, that is, a time (t2−t1) from starting of the integration to estimation of the SOC.

(S150) Correction of Estimated Value of Parking-Time Discharge Current Ic

Then, the CPU 71 performs processing of correcting estimated values of the parking-time discharge current Ic stored in the memory 73. To be more specific, the estimated value of the parking-time discharge current Ic is corrected based on an error amount ε. For example, the following equation 6 can be used as a correction equation of the parking-time discharge current Ic.

$$Icr = Ico - \varepsilon \qquad \text{[Equation 6]}$$

"Icr" indicates the estimated value after correction of the parking-time discharge current Ic, and "Ico" indicates the estimated value (initial value) of the parking-time discharge current Ic.

In this manner, the estimated value of the parking-time discharge current Ic can be corrected in accordance with six steps (S100 to S150).

Then, the CPU 71 performs processing of correcting an estimated value of a parking-time discharge current Ic. Thereafter, the CPU 71 performs estimation of an SOC by applying estimated values after correction. That is, when the automobile 1 is in a parking state (S40 in FIG. 6: YES), an SOC is estimated by integrating estimated values Icr after correction (S50 in FIG. 6)

After step S150 is performed, as the flow of the processing, the processing advances to step S85 as shown in FIG. 9. In step S85, the CPU performs processing for determining whether or not a predetermined period elapses from a point of time of the previous-time amendment. When the predetermined period elapses, the determination made in step S85 is affirmative (YES), and the processing advances to step S83. Accordingly, the processing for correcting an estimated value of a parking-time discharge current Ic is repeated for each time a predetermined time elapses from a point of time of the previous-time amendment.

In this manner, according to the second embodiment, an estimated value of a parking-time discharge current Ic can be corrected and hence, it is possible to make the estimated value of the parking-time discharge current Ic approximate a true value. Accordingly, estimation accuracy of an SOC during a parking time can be enhanced. Particularly, an error amount ε of an estimated value of a parking-time discharge current Ic is obtained in a state where the battery module 20 is actually mounted on the automobile 1 and hence, it is possible to suppress an error of an estimated value due to variation of parking-time discharge currents Ic for respective automobiles 1. Further, according to this embodiment, a parking-time discharge current Ic can be corrected without using the current sensor 41.

It is preferable that processing for correcting an estimated value of a parking-time discharge current Ic (initial-time correction) be performed before the manufactured motorcycle 1 is delivered to an end user (for example, during a period where the manufactured vehicle is transferred to a sales shop or the like). By performing the processing for correcting the estimated value of the parking-time discharge current Ic in this manner, it is possible to deliver the automobile 1 to the end user in a state where an error of the estimated value of the parking-time discharge current Ic is suppressed. The correction processing can be performed during a transport period and hence, a manufacturing step (a correction processing step before shipping) can be eliminated.

Further, in this embodiment, the processing for correcting an estimated value of a parking-time discharge current Ic is repeatedly performed each time a predetermined period elapses from a point of time of previous-time correction. By performing the processing in this manner, the estimated value of the parking-time discharge current Ic is updated for each predetermined period and hence, it is possible to further effectively suppress an error of the estimated value of the parking-time discharge current Ic. Accordingly, estimation accuracy of an SOC during parking can be enhanced.

An updating cycle of a parking-time discharge current Ic is one day or two days, for example, so that the updating cycle is sufficiently long compared to a measurement cycle of an SOC. Accordingly, when a parking-time discharge current Ic is updated, until a period that the updating cycle elapses thereafter, the estimation of an SOC is performed using the same value as an estimated value of a parking-time discharge current Ic.

Further, in the second embodiment, the CPU 71 determines abnormality of the battery module 20 based on a difference $\Delta SOC$ of an SOC calculated in step S130. To be more specific, magnitude of the difference $\Delta SOC$ per unit time is calculated by dividing the difference $\Delta SOC$ by an integration time T.

Then, processing is performed where the calculated difference $\Delta SOC$ per unit time and a predetermined reference value are compared to each other. It is determined that the battery module 20 is normal when the difference $\Delta SOC$ per unit time is smaller than the reference value. On the other hand, it is determined that the battery module 20 is abnormal when the difference $\Delta SOC$ per unit time is larger than the reference value. With such determination, for example, it is possible to detect abnormality where internal short-circuiting exists in the battery module 20 so that the secondary battery 31 discharges an electric current exceeding a parking-time discharge current Ic during parking.

<Third Embodiment>

Next, a third embodiment of the present invention is described with reference to FIG. 11.

Figure 11:
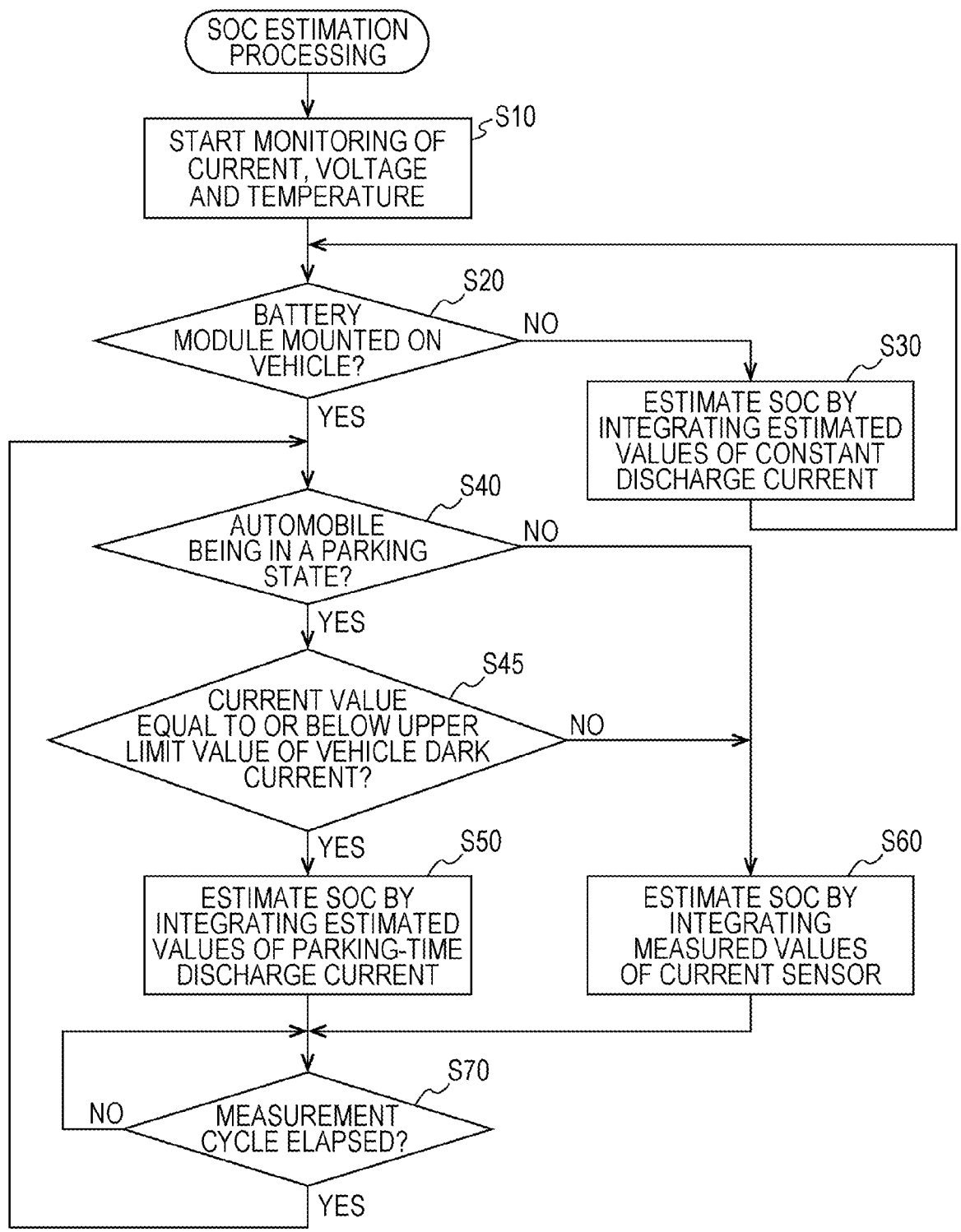
FIG. 11 is a flowchart showing the flow of SOC estimation processing applied to a third embodiment.

FIG. 11 is a flowchart of SOC estimation processing applied to the third embodiment. In the third embodiment, processing in step "S45" is added to the SOC estimation processing of the first embodiment described with reference to FIG. 6.

To be more specific, the processing in step "S45" is processing where it is determined whether or not an electric current flowing into an automobile 1 from a secondary battery 31 is regarded as a vehicle dark current Ic2 after the processing advances to a parking state. That is, a CPU 71 performs processing of comparing an electric current value detected by a current sensor 41 and a threshold value to each other. The threshold value is an upper limit value of the vehicle dark current Ic2 predicted based on a consumption current of a certain electric load and variation of the consumption current.

Then, when a current value detected by the current sensor 41 is equal to or below a threshold value (S45: YES), that is, when an electric current which flows into the automobile 1 from the secondary battery 31 is smaller than an upper limit value of a vehicle dark current Ic2, the CPU 71 estimates an SOC of the secondary battery 31 by integrating estimated values of the parking-time discharge currents Ic stored in the memory 73 (S50). The processing in step S50 corresponds to first SOC estimation processing of the present invention.

On the other hand, when a current value detected by the current sensor 41 is larger than a threshold value (S45: NO), that is, an electric current larger than an upper limit value of a vehicle dark current Ic2 flows into the vehicle from the secondary battery 31, the CPU 71 estimates an SOC of the secondary battery 31 by integrating measured values of the current sensor 41 (S60). The processing in step S60 corresponds to second SOC estimation processing of the present invention.

In this manner, according to the third embodiment, even during parking, when an electric current larger than an upper limit value of a vehicle dark current Ic2 flows into the automobile 1 from the secondary battery 31 (for example, a case where an electric load which is turned off during parking is turned on even after parking due to some reason), an SOC is estimated by integrating measured values of the current sensor 41. Accordingly, it is possible to enhance estimation accuracy of an SOC compared to a case where an SOC is estimated by constantly using an estimated value of a parking-time discharge current Ic during a parking period.

<Other Embodiments>

The present invention is not limited to the embodiments which have been described with reference to the above-mentioned description and drawings. For example, the following embodiments are also included in the technical scope of the present invention.

(1) In the above-mentioned embodiments 1 to 3, as one example of "energy storage device", a lithium ion secondary battery is exemplified. However, the present invention is not limited to a lithium ion secondary battery. For example, the energy storage device may be another secondary battery such as a lead-acid battery. Further, the energy storage device may be a capacitor.

(2) In the above-mentioned embodiments 1 to 3, as one example of "vehicle", the automobile 1 is exemplified. However, the techniques of the present invention are applicable to a vehicle other than the automobile 1 such as a three-wheeled automobile or a light vehicle. Further, the techniques of the present invention are also applicable to a bus or the like.

(3) In the above-mentioned first embodiment, the example is described where whether or not the automobile 1 is in a parking state is determined based on communication with the vehicle ECU 10B. However, the determination on whether or not the automobile 1 is in a parking state is not limited to the determination exemplified in the first embodiment, and may be performed by other methods. For example, the determination may be made based on a current value of the secondary battery 31.

(4) In the above-mentioned first embodiment, the example is described where an estimated value of a parking-time discharge current Ic is stored in the memory 73 in advance. However, it is not always necessary to store a parking-time discharge current Ic. It may be possible that only data on an estimated value of a constant discharge current Ic1 and an estimated value of a vehicle dark current Ic2 are stored in the memory 73, and a parking-time discharge current Ic is calculated as a sum of the estimated value of the constant discharge current Ic1 and the estimated value of the vehicle dark current Ic2 stored in the memory 73. That is, it may be possible that data for obtaining an estimated value of a parking-time discharge current Ic (the estimated value of the constant discharge current Ic1 and the estimated value of the vehicle dark current Ic2 in the above-mentioned example) are stored in the memory 73, and a parking-time discharge current Ic is obtained based on these data. The data on the estimated value of the constant discharge current Ic1 and the data on the estimated value of the vehicle dark current Ic2 form one example of data for calculating the parking-time discharge current Ic.

(5) In the above-mentioned first embodiment, the case is exemplified where three data consisting of an estimated value of a constant discharge current Ic1, an estimated value of a vehicle dark current Ic2 and an estimated value of a parking-time discharge current Ic are stored in the memory 73 in advance. However, when the processing in step S30 is not performed, only the estimated value of the parking-time discharge current Ic may be stored in the memory 73.

(6) A constant discharge current Ic1 is an electric current which the secondary battery 31 constantly discharges regardless of an in-use state of the secondary battery 31, and the constant discharge current Ic1 includes a self discharge current and a consumption current of the BM 50. A self discharge current and a consumption current of the BM 50 have a tendency that the lower a battery voltage or an SOC of the secondary battery 31, the smaller the self discharge current and the consumption current of the BM 50 become. Values of the self discharge current and the consumption current of the BM 50 change depending on a battery voltage and the SOC. In the above-mentioned first embodiment, a constant discharge current Ic1 is set to a fixed value. However, a value which corresponds to a battery voltage or an SOC may be stored in the memory 73 as a constant discharge current Ic1 such that the constant discharge current Ic1 is stored for respective battery voltages of the secondary battery 31 or the constant discharge current Ic1 is stored for respective SOCs. When an SOC is estimated during parking, a constant discharge current Ic1 which corresponds to a battery voltage or a value of an SOC may be read out, and a parking-time discharge current Ic may be obtained by adding the constant discharge current Ic1 to a vehicle dark current Ic2.

(7) In the first embodiment, the example is described where an SOC of the secondary battery 31 is estimated by integrating measured values of the current sensor 41 when the automobile 1 is not in a parking state such as traveling or stopping (S60). Besides such an example, in the case where the automobile 1 is not in a parking state such as a state where the automobile 1 is traveling or a state where the automobile 1 is stopped, an SOC of the secondary battery 31 may be estimated by integrating electric currents each of which is obtained by adding a constant discharge current Ic1 to a measured value of the current sensor 41. With such an estimation, estimation accuracy of the SOC can be further enhanced.

(8) In the first embodiment, the example is described where the estimation processing of an SOC is performed at a predetermined measurement cycle. However, the measurement cycle may be changed depending on a state of the automobile 1. For example, frequency of performing estimation processing of an SOC may be lowered during parking by setting the measurement cycle during parking longer than the measurement cycle during traveling. With such an operation, a consumption current during parking can be suppressed thus contributing the prevention of an over discharge.

(9) In the first embodiment, the example is described where the ground line of the BM 50 is connected to the node J2 on an assembled battery 30 side of the current sensor 41. However, for example, the ground line of the BM 50 may be connected to the node J3 on a terminal portion 22N side of the current sensor 41. When the ground line of the BM 50 is connected to the node J2, a measured value of the current sensor 41 includes only an electric current which flows into the vehicle from the assembled battery 30 and does not include a consumption current of the BM 50. However, when the ground line of the BM 50 is connected to the node J3, a measured value of the current sensor 41 includes both an electric current which flows into the vehicle from the assembled battery 30 and a consumption current of the BM 50.

(10) In the second embodiment, the example is described where an estimated value of a parking-time discharge current Ic is corrected based on a difference $\Delta SOC$ between SOCs estimated by two methods, that is, an OCV method and a current integration method respectively. However, the method of correcting an estimated value of a parking-time discharge current Ic is not limited to the method exemplified in the second embodiment, and other methods can be used. For example, when an estimation value of a parking-time discharge current Ic is written in the memory 73, and a certain electric load which consumes an electric current during parking is mounted on the automobile 1 later, a consumption current of the electric load mounted later becomes an error of a vehicle dark current Ic2 and the parking-time discharge current Ic. Accordingly, in the case where there is an electric load mounted on the automobile 1 later, estimated values of a vehicle dark current Ic2 and a parking-time discharge current Ic may be corrected and a consumption current of the added electric load may be added to the estimated values of the respective electric currents Ic2, Ic before the electric load is added. That is, the BM 50 may obtain an error amount of an estimated value of a parking-time discharge current Ic (in this case, a consumption current of the added electric load) from the outside, and may correct an estimated value Ic of a parking-time current.

In the second embodiment, the example is described where an estimated value of a parking-time discharge current Ic is corrected based on a difference $\Delta SOC$ between SOCs estimated by two methods, that is, an OCV method and a current integration method and an integration time T. Besides such an example, an estimated value of a parking-time discharge current Ic may be corrected based on a difference $\Delta Ys$ between capacitances Y estimated by two methods, that is, an OCV method and a current integration method and an integration time T.

The correction processing (S100 to S150) described in the second embodiment is also applicable to the case where the processing in step S45 is performed as in the case of the third embodiment.

(12) When a kind of the automobile 1 differs, an electric load mounted on the automobile 1 differs. Accordingly, in the first embodiment, the example is exemplified where estimated values of a vehicle dark current Ic2 and a parking-time discharge current Ic are changed corresponding to a kind of the automobile 1 which is an object on which the battery module 20 is mounted. Electric loads mounted on the automobile may differ from each other in grade although the automobiles are of the same kind. Accordingly, when the electric loads mounted on the automobile differ from each other depending on grade, estimated values of a vehicle dark current Ic2 and a parking-time discharge current Ic written in the memory 73 may be changed corresponding to the grade of the automobile which is an object on which the battery module 20 is mounted.

(13) In the first embodiment, whether or not the battery module 20 is mounted on the automobile 1 is determined based on whether or not a large discharge current is momentarily detected based on an output from the current sensor 41. The method of determining whether or not the battery module 20 is mounted on the automobile 1 is not limited to the above-mentioned method. For example, whether or not the battery module 20 is mounted on the automobile 1 may be determined whether or not the communication connector 95 is connected to the connector connecting portion 90.

What is claimed is:

1. A monitoring device for an energy storage device mounted on a vehicle, the monitoring device comprising:
    a memory; and
    a processor,
    wherein the memory is configured to store at least one of
        data on an estimated value of a parking-time discharge current, which the energy storage device discharges during parking, and data for calculating the estimated value of the parking-time discharge current,
    the monitoring device is connected to a current sensor which detects an electric current which flows in the energy storage device, and
    the processor is configured to perform first state of charge (SOC) estimation processing in which an SOC of the energy storage device is estimated by integrating estimated values of the parking-time discharge current based on the data stored in the memory when the vehicle is in a parking state.

2. The monitoring device for an energy storage device according to claim 1, wherein the parking-time discharge current is a total electric current that is the sum of a constant discharge current, which the energy storage device constantly discharges, and a vehicle dark current, which flows into a certain electric load of the vehicle from the energy storage device during parking, and
    the memory is configured to store at least data on an estimated value of the constant discharge current, and data on an estimated value of the vehicle dark current.

3. The monitoring device for an energy storage device according to claim 2, wherein the processor is configured to estimate an SOC of the energy storage device by integrating the estimated values of the constant discharge current when mounting of the energy storage device on the vehicle is not detected, and
    the processor performs the first SOC estimation processing in which the SOC of the energy storage device is estimated by integrating the estimated values of the parking-time discharge current when the vehicle is shifted to a parking state after mounting of the energy storage device on the vehicle is detected.

4. The monitoring device for an energy storage device according to claim 2, wherein the processor determines whether or not an electric current equal to or less than an upper limit value of the vehicle dark current flows into the vehicle from the energy storage device based on a measured value of the current sensor, the processor performs the first SOC estimation processing when the vehicle is in a parking state, and the electric current equal to or less than the upper limit value of the vehicle dark current flows into the vehicle from the energy storage device, and the processor performs second SOC estimation processing for estimating the SOC of the energy storage device by integrating an electric current of the energy storage device measured by the current sensor when the vehicle is in a parking state, and an electric current larger than the upper limit value of the vehicle dark current flows into the vehicle from the energy storage device.

5. The monitoring device for an energy storage device according to claim 2, wherein the estimated value of the vehicle dark current stored in the memory is a value which differs depending on a kind or a grade of the vehicle.

6. The monitoring device for an energy storage device according to claim 1, wherein the processor performs:
    processing where the processor acquires an error amount of the estimated value of the parking-time discharge current from the outside or calculates the error amount internally; and
    correction processing where the processor corrects the estimated value of the parking-time discharge current stored in the memory based on the acquired or calculated error amount.

7. The monitoring device for an energy storage device according to claim 6, wherein the processor calculates an error amount of the estimated value of the parking-time discharge current based on a difference between the SOC estimated by an open circuit voltage (OCV) method during parking of the vehicle and the SOC estimated by a current integration method which integrates the estimated values of the parking-time discharge current or a difference between capacitance estimated by the OCV method and capacitance estimated by the current integration method which integrates the estimated values of the parking-time discharge current, and an integration time T of the estimated value.

8. The monitoring device for an energy storage device according to claim 7, wherein the processor determines that the energy storage device is in an abnormal state when the difference between the SOCs or a magnitude of the difference between the capacitances per unit time exceeds a reference value.

9. An energy storage device module comprising:
    an energy storage device;
    a current sensor for measuring an electric current which flows in the energy storage device; and
    the monitoring device of an energy storage device according to claim 1.

10. The energy storage device module according to claim 9, wherein the energy storage device is a lithium ion secondary battery.

11. The monitoring device for an energy storage device according to claim 1, further comprising:
    a communication part which is connected through a communication line to an electronic control unit (ECU) of the vehicle.

12. The monitoring device for an energy storage device according to claim 1, wherein the estimated values of the parking-time discharge current are stored in the memory in advance.

13. The monitoring device for an energy storage device according to claim 1, wherein when the vehicle is not in a parking state, the processor performs second SOC estimation processing in which the SOC of the energy storage device is estimated based on an output of the current sensor.

14. A method of estimating a state of charge (SOC) of an energy storage device mounted on a vehicle, the method comprising:
    detecting an electric current which flows in the energy storage device using a current sensor;
    causing a memory to store at least one of data of an estimated value of a parking-time discharge current, which an energy storage device discharges during parking, and data for calculating the estimated value of the parking-time discharge current; and
    estimating an SOC of the energy storage device by not integrating the electric current detected by the current sensor, and integrating the estimated values of the parking-time discharge current based on the data stored in the memory when the vehicle is in a parking state.

15. An energy storage device module comprising:
    an energy storage device;
    a current sensor for detecting an electric current which flows in the energy storage device; and
    a battery management device comprising a control part which stores data and:
        estimates a state of charge (SOC) of the energy storage device based on the stored data when the vehicle is in a parking state; and
        estimates an SOC of the energy storage device based on an output of the current sensor when the vehicle is not in a parking state,
    wherein the control part comprises:
        a memory which stores at least one of:
            data on an estimated value of a parking-time discharge current, which the energy storage device discharges during parking; and
            data for calculating the estimated value of the parking-time discharge current; and
        a processor which performs first SOC estimation processing in which an SOC of the energy storage device is estimated by integrating, estimated values of the parking-time discharge current based on the data stored in the memory when the vehicle is in a parking state.

16. The energy storage device module according to claim 15, wherein the battery management device further comprises a voltage detecting circuit which measures a voltage of the energy storage device in response to an instruction from the control part.

17. The energy storage device module according to claim 15, wherein the control part further comprises a communication part which is connected through a communication line to an electronic control unit (ECU) of the vehicle.

18. The energy storage device module according to claim 15, further comprising:
    a current cut-off device which cuts off electric current of the energy storage device in response to an instruction from the control part.

19. The energy storage device module according to claim 18, further comprising:
    a first terminal to which the current sensor is connected; and
    a second terminal to which the current cut-off device is connected,
    wherein the energy storage device, the current sensor and the current cut-off device are connected to each other in series through a connecting line.

20. The energy storage device module according to claim 15, further comprising:
    a battery case which houses the energy storage device, the current sensor, and the battery management device.

21. The energy storage device module according to claim 20, further comprising:
    a printed circuit board on which the battery management device is formed,
    wherein the battery case comprises an intermediate lid formed on the energy storage device, and an upper lid formed on the intermediate lid, and the printed circuit board is formed between the intermediate lid and the upper lid.

* * * * *